United States Patent
Mijac et al.

(10) Patent No.: US 9,661,773 B2
(45) Date of Patent: May 23, 2017

(54) ELECTRICAL ASSEMBLY FOR A MOTOR VEHICLE

(71) Applicant: BROSE FAHRZEUGTEILE GMBH & CO. KOMMANDITGESELLSCHAFT, HALLSTADT, Hallstadt (DE)

(72) Inventors: Anto Mijac, Bamberg (DE); Maik Ruemmler, Baunach (DE); Johannes Dippold, Bamberg (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 11 days.

(21) Appl. No.: 14/718,601

(22) Filed: May 21, 2015

(65) Prior Publication Data

US 2015/0342071 A1    Nov. 26, 2015

(30) Foreign Application Priority Data

May 21, 2014   (DE) ........................ 10 2014 007 443

(51) Int. Cl.
| | |
|---|---|
| *H05K 5/06* | (2006.01) |
| *H05K 5/00* | (2006.01) |
| *B60R 16/02* | (2006.01) |
| *H05K 5/03* | (2006.01) |
| *H05K 7/14* | (2006.01) |

(52) U.S. Cl.
CPC ............ *H05K 5/064* (2013.01); *B60R 16/02* (2013.01); *H05K 5/0056* (2013.01); *H05K 5/0069* (2013.01); *H05K 5/03* (2013.01); *H05K 7/14* (2013.01)

(58) Field of Classification Search
None
See application file for complete search history.

(56) References Cited

U.S. PATENT DOCUMENTS

| 3,705,997 A | 12/1972 | Bauerle et al. |
|---|---|---|
| 3,914,632 A | 10/1975 | Nylen |
| | (Continued) | |

FOREIGN PATENT DOCUMENTS

| DE | 1240172 B | 5/1967 |
|---|---|---|
| DE | 2034502 A1 | 1/1972 |
| | (Continued) | |

*Primary Examiner* — Xanthia C Cunningham
(74) *Attorney, Agent, or Firm* — Laurence A. Greenberg; Werner H. Stemer; Ralph E. Locher

(57) ABSTRACT

An electrical assembly for a motor vehicle includes a housing and two groups of electronic components that are installed in the housing and are encased using a thermosetting potting compound. Furthermore, the assembly includes two groups of connecting contacts. One of the connecting contacts is allocated respectively to one of the two groups of the electronic components. The connecting contacts are guided through the housing so as to electrically contact the respective electronic component. At least one of the groups of connecting contacts is surrounded on the inner side of the housing by a sealing collar that protrudes from the housing. The sealing collar is embedded during the process of assembling the assembly entirely or in part in the potting compound prior to the curing of the thermosetting potting compound.

8 Claims, 2 Drawing Sheets

(56) References Cited

U.S. PATENT DOCUMENTS

| | | | |
|---|---|---|---|
| 4,893,215 A | 1/1990 | Urushiwara et al. | |
| 5,079,672 A | 1/1992 | Haubner et al. | |
| 5,586,388 A * | 12/1996 | Hirao | H01L 21/4842 174/521 |
| 5,646,827 A * | 7/1997 | Hirao | H01L 23/49811 257/E23.066 |
| 5,657,203 A * | 8/1997 | Hirao | H01L 21/4842 257/E23.066 |
| 5,747,875 A * | 5/1998 | Oshima | H01L 25/16 257/687 |
| 5,966,291 A * | 10/1999 | Baumel | H05K 7/20927 165/80.3 |
| 6,304,448 B1 * | 10/2001 | Fukada | H05K 7/209 174/16.3 |
| 6,521,983 B1 * | 2/2003 | Yoshimatsu | H01L 24/49 257/678 |
| 6,770,964 B2 * | 8/2004 | Hiyoshi | H01L 23/24 257/690 |
| 6,873,042 B2 * | 3/2005 | Ishii | H01L 25/072 257/702 |
| 7,209,367 B2 * | 4/2007 | Nakano | H05K 3/3405 361/775 |
| 7,808,100 B2 * | 10/2010 | Bayerer | H01L 24/06 174/261 |
| 8,102,655 B2 * | 1/2012 | Sakamoto | H05K 1/144 174/520 |
| 8,102,670 B2 * | 1/2012 | Sakamoto | H05K 1/144 361/792 |
| 8,107,255 B2 * | 1/2012 | Sakamoto | H05K 1/144 361/695 |
| 8,169,784 B2 * | 5/2012 | Sakamoto | H01L 25/162 361/729 |
| 8,237,260 B2 * | 8/2012 | Tschirbs | H01L 23/13 257/684 |
| 8,670,240 B2 * | 3/2014 | Hashimoto | H05K 5/0052 361/704 |
| 8,879,256 B2 * | 11/2014 | Ichijyo | H05K 7/20927 165/104.33 |
| 2005/0085108 A1 * | 4/2005 | Park | H05K 1/18 439/78 |
| 2008/0207015 A1 * | 8/2008 | Sueyoshi | H05K 3/308 439/75 |
| 2009/0086455 A1 * | 4/2009 | Sakamoto | H05K 1/144 361/796 |
| 2009/0213553 A1 * | 8/2009 | Tschirbs | H01L 23/053 361/709 |
| 2013/0286597 A1 * | 10/2013 | Zhang | H05K 5/0056 361/720 |
| 2014/0196946 A1 * | 7/2014 | Van Reybrouck | B60T 17/00 174/535 |

FOREIGN PATENT DOCUMENTS

| | | |
|---|---|---|
| DE | 7102099 U | 7/1972 |
| DE | 2416411 A1 | 10/1974 |
| DE | 2328698 B2 | 12/1974 |
| DE | 3716102 A1 | 11/1988 |
| DE | 3879066 T2 | 9/1993 |
| DE | 102013200794 A1 | 7/2014 |
| GB | 942026 A | 11/1963 |
| GB | 1428054 A | 3/1976 |
| JP | 2007267456 | 10/2007 |

* cited by examiner

ELECTRICAL ASSEMBLY FOR A MOTOR VEHICLE

BACKGROUND OF THE INVENTION

Field of the Invention

The invention relates to an electrical assembly for a motor vehicle, in particular an electrical assembly having a housing and a number of electronic components are received in said housing.

In the case of motor vehicles, electrical assemblies are used for example as a control unit for an electro-motorized drive and/or so as to evaluate sensor signals. Said electrical assemblies are often installed in areas in which these assemblies are exposed to (condensation) moisture or wet conditions (by way of example, water spray). These areas are in this respect often described as "wet spaces" and are expediently separated from the vehicle interior ("dry space") by means of a media-impermeable barrier. By way of example, an electric window actuator (and also its control unit) is arranged in a side door of a motor vehicle generally in the wet space of the side door.

The electrical assemblies usually comprise one (or multiple) circuit carriers and a number of electronic components are arranged on said circuit carriers, by way of example capacitors, transformers, integrated switching circuits and the like. The components are in particular soldered to the circuit carrier in order on the one hand to render possible a galvanic (in other words electrically conductive) connection of the components to the circuit carrier and on the other hand to render possible a mechanical stability. In order to protect the components in particular against moisture and therefore short circuits, and also to further increase the mechanical stability, the circuit carriers having the components that are arranged on them are generally encased using a potting compound (usually a potting resin, for example epoxy resin, phenolic resin or polyurethane resin). The circuit carrier together with the components arranged thereon is often encapsulated in a housing.

Connecting contacts are guided out of the potting compound and in particular out of the housing so as to transfer signals and energy from and to the electronic components, said connecting contacts being connected to an energy source and/or a lower or higher ranking signal receiver (for example the window actuating motor).

Multiple functions having in each case current circuits that are separated from one another are frequently integrated in an electrical assembly. In the case of moisture having penetrated into the housing of the assembly, there is the danger of short circuits if in particular a moisture bridge forms between the respective connecting contacts of the different current circuits. For this reason, the leak-tightness of the housing and in particular the protection against a short circuit is highly significant.

BRIEF SUMMARY OF THE INVENTION

The object of the invention is to increase the operational reliability of an electrical assembly.

This object is achieved in accordance with the invention by virtue of an electrical assembly as claimed. Advantageous and in part inventive embodiments and further developments of the invention are disclosed in the dependent claims and the description hereinunder.

The electronic assembly in accordance with the invention for a motor vehicle comprises a housing and two groups of electronic components. These electronic components are arranged in the housing and are encased in the intended final assembly state by a thermoset (in other words cross-linked) potting compound. Furthermore, the electrical assembly comprises two groups of connecting contacts (hereinunder in each case described as a "contact group"), wherein in each case a contact group is allocated in each case to one of the two groups of electronic components. The contact groups comprise preferably in each case two connecting contacts (a pair of connecting contacts). The connecting contacts of the two contact groups penetrate the housing so as to electrically contact the respective electronic components. At least one of the contact groups (in other words one of the pairs) is surrounded on the inner side of the housing by a sealing collar that protrudes from the housing towards the interior and preferably extends in a circumferential manner around the respective contact group. The sealing collar is entirely or in part embedded in the potting compound in the intended final assembly state. It is necessary for the edge of the sealing collar to be extensively immersed in the potting compound so that the opening of the sealing collar is entirely sealed by means of the potting compound in a leak-tight manner.

Moreover, at least one of the contact groups is sealed on the inner side of the housing with respect to the other contact group by means of the sealing collar and the potting compound. The sealing collar therefore forms with the housing wall a type of pot or beaker, the connecting contacts penetrate the housing wall in the base of said pot and the wall of said pot is immersed in the potting compound so that (virtually) no moisture can penetrate from the outer side of the pot wall into the pot interior and therefore to the connecting contacts extending therein. In the case of moisture penetrating the housing in one place, for example by way of a rip in the housing or along one of the connecting contacts, the sealing collar that is embedded in the potting compound subsequently effectively prevents an electrically conductive connection ("moisture bridge") from forming between the two contact groups and producing a short circuit between the respective current circuits. A case of this type of a housing that is not sealed (in one place) is also described as a "single failure".

Advantageously, also for the case that the surface between the sealing collar and the potting compound is not entirely sealed, a type of labyrinth seal is embodied by means of immersing the sealing collar in the potting compound so that the (leakage) path between the two contact groups is increased for moisture that is spreading and for any leakage currents in such a manner that the risk of a short circuit is advantageously reduced. As a consequence, the operational reliability of the electrical assembly is also ensured in a simple manner in the case of a single failure.

It is preferred that the housing is injection molded from a synthetic material, wherein the sealing collar is formed as one on the housing (as one piece) in a simple manner as far as production technology is concerned.

It is preferred that the two groups of the electronic components are arranged on a respective allocated circuit carrier. Within the scope of the invention, it is however also feasible that all the electronic components of the two groups are arranged on a common circuit carrier.

The phrase "an electronic component" is to be understood here and hereinunder to mean a component of an electrical circuit that is considered to be a unit. As an electronic component, it is possible consequently by way of example to draw upon a resistor, a capacitor, a coil, a transistor or also an integrated circuit (for example a microprocessor). The phrase "circuit carrier" is understood here and hereinunder to mean in particular a circuit board to which are attached conductor paths so as to electrically contact the individual electronic components. The circuit carrier is embodied by way of example as a printed circuit board (PCB for short). It is preferred that the circuit carrier is populated with the respective electronic components in advance and in particular soldered prior to being installed in the housing. Particularly large electronic components such as by way of example a coil (also described as an inductor) or an electrolytic capacitor can however within the scope of the invention also be assembled separately from the circuit carrier in the housing and where necessary during the (subsequent) assembly of the circuit carrier in the housing can be contacted by said circuit carrier (in other words in particular by its conductor paths).

The connector contacts are in particular so-called contact pins, in other words comparatively rigid (metal) pins that are designed and provided for a plug connection to mating contacts (the latter usually in the form of sleeves or resilient element contacts). Within the scope of the invention, it is however also possible for the mating contacts to be comparatively flexible sheet metal tabs that for example are contacted by an energy source or the like by way of a contact force-free connecting base (zero insert force connector, or ZIF-connector for short).

The phrase "cross-linked (thermoset) potting compound" is to be understood here and hereinunder to mean the rigid (fixed or hard) final product of a synthetic material that can be cross-linked. The latter is in particular a thermosetting synthetic material (preferably a so-called potting resin) that after thermosetting, which typically occurs by means of a chemical cross-linked reaction, can no longer be melted and preferably is not soluble. Conventionally, a resin (for example epoxy, polyurethane or phenolic resin) and also an associated (reactive) hardening agent are initially mixed and subsequently poured into the housing so as to process a potting compound of this type. The thermosetting process occurs either independently after mixing the hardening agent (in particular in the case of a so-called cold setting potting resin) or is triggered by means of supplying heat (in the case of a thermosetting potting resin) or additional substances (for example moisture) (where necessary the cross-linking reaction is maintained by means of a constant supply of heat). However, a material that can also still be deformed in a resilient manner in the cross-linked state can also be used as a potting compound.

In a preferred embodiment of the electrical assembly, the two groups of electronic components are designed so as to operate in each case at different operating voltages, for example 12 and 48 V or 12 and 24 V. The higher operating voltage is used by way of example to supply a motor that is connected downstream of the electrical assembly. The lower operating voltage is used by way of example to supply control components such as for example microcontrollers or other integrated switching circuits and/or for the exchange of signals between the assembly and sensors or other control devices, for example by way of a data bus. The operating voltages are in particular connected to a common ground (namely the vehicle body). The sealing collar consequently prevents the two operating voltage networks ("vehicle electrical systems") becoming short circuited to one another in the case of a single failure which in turn would lead to a higher probability of destroying components at least of the current circuit that is operated at a lower operating voltage.

In order to further improve the operational reliability, in a particularly advantageous embodiment, each of the contact groups is surrounded on the inner side of the housing by a respective sealing collar that is entirely or in part embedded in the potting compound in the intended final assembly state as described above. As a consequence, in the case of a double failure in the electrical assembly (for example in the case of moisture penetrating each contact group) a short circuit of the respective current circuit of the two groups of the electronic components, in particular of the two different vehicle electrical systems, is prevented or at least the risk of a short circuit is kept as low as possible.

In an expedient embodiment, the housing comprises a housing base part and a housing cover. Within the scope of the invention, it is fundamentally possible that the connecting contacts are guided through the housing base part in the intended final assembly state. However, it is preferred that the connecting contacts (in particular the two connecting groups) are guided through the housing cover in the intended final assembly state. In this case, consequently the one or rather where necessary more sealing collars are also formed on the inner side of the housing cover. Likewise within the scope of the invention, it is also feasible that one contact group is guided through the housing base part and the other contact group is guided through the housing cover.

The electronic components of the two groups are expediently arranged in each case on a circuit carrier (in other words a circuit board). The two groups can be arranged within the scope of the invention on separate circuit carriers so that in each case an individual circuit carrier is provided for each group of components (and where necessary the respective allocated operating voltage). Alternatively, the components of the two groups within the scope of the invention can however also be constructed on a common circuit carrier.

In order to render possible a mechanically stable and (media-impermeable) connection of the electrical assembly to preferably a respective plug connector that carries mating contacts (so as to contact a current cable and/or signal cable), in one expedient embodiment, each connector group is surrounded on the outer side of the housing in a circumferential manner by a respective connecting collar that protrudes from the housing (in particular the housing cover). In other words, each connecting collar forms on the outer side of the housing a pot in whose base the connecting contacts protrude from the housing. The respective connecting collar carries in particular means for mechanically fixing the plug connector such as for example a thread or latching hooks and preferably also means for sealing the plug connection (by way of example a sealing ring). The respective plug connector is plugged onto the connecting collar so as to contact the current or signal cable and fixes to said connecting collar, wherein the connecting contacts are electrically contacted by the mating contacts.

In a preferred embodiment, the potting compound is a polyaddition thermosetting synthetic material. Advantageously, in the case of a polyaddition cross-linked reaction no by-products are produced (such as for example water) that would then have to be discharged so that the potting compound can thermoset in the preferably sealed closed housing.

The two groups of electronic components are expediently arranged initially in the housing, in particular in the housing base part, so as to assemble the above described electrical assembly. The housing, in other words in particular the housing base part, is subsequently filled with thermosetting potting compound in such a manner that the two groups of electronic components are preferably entirely encased by the potting compound and in the intended end assembly state, the one or rather more sealing collars are entirely or in part embedded in the potting compound. In particular for the case that the connecting contacts of the two connecting groups are guided through the housing base part to the outer side of the housing, the components (in particular the one or rather more respective circuit carriers) are positioned in the housing base part and the connecting contacts are preferably guided through the apertures that complement the connecting contacts in the housing base part prior to pouring in the potting compound. In another case, the connecting contacts are guided through the housing (in particular through the housing cover) after pouring in the potting compound. The potting compound subsequently thermosets or is thermoset (preferably by means of supplying heat).

In the latter case, prior to the potting compound thermosetting, the housing cover is expediently combined with the housing base part in such a manner that the connecting contacts protrude through the housing cover in particular through its apertures within the sealing collar and where necessary within the connecting collar. The one or rather more sealing collars are entirely or in part pressed into or immersed on the inner side of the housing in the potting compound that is not yet cross-linked.

By virtue of the fact that the one or rather more sealing collars are already in particular formed as one on the housing (the housing base part or the housing cover) in an integral manner and consequently during assembly are preferably automatically embedded in the potting compound, additional steps for sealing the individual connecting groups can be advantageously omitted. Consequently, the operating reliability is increased using a comparatively low outlay relating to production and assembly.

BRIEF DESCRIPTION OF THE SEVERAL VIEWS OF THE DRAWING

Exemplary embodiments of the invention are further explained hereinunder with reference to a drawing. In the drawing.

Parts that correspond to one another are always provided with identical reference numerals in all the figures.

DESCRIPTION OF THE INVENTION

Figure 1:
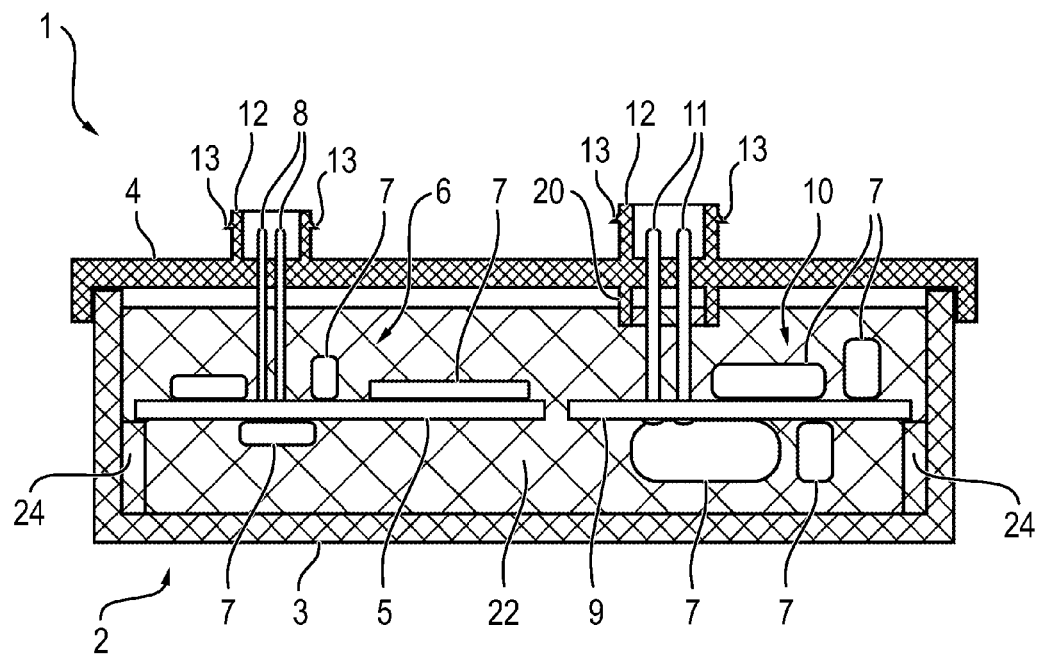
FIGS. 1 to 3 illustrate a schematic cross sectional view in each case of an exemplary embodiment of an electrical assembly having two groups of electronic components and also in each case allocated connecting contacts that are protected against a short circuit caused by moisture.

FIG. 1 illustrates an electrical assembly 1 for a motor vehicle, said electrical assembly being used in an exemplary manner as a control unit for an electrical window actuator. Alternatively, the assembly 1 can also be installed to control an electrical pump for a cooling medium. The assembly 1 comprises a housing 2 that is divided into a housing base part 3 and a housing cover 4. Furthermore, the assembly 1 comprises a first circuit carrier 5 and a first group 6 of electronic components 7 (resistors, capacitors, coils, transistors or also microprocessors) is arranged on said circuit carrier. The first group 6 is allocated a pair of connecting contacts in the form of contact pins 8. These contact pins 8 are soldered to the circuit carrier 5 and are designed and provided so as to connect the group 6 of the components 7 to an energy source, namely a vehicle electrical system that provides an operating voltage of 12V. Furthermore, the assembly 1 comprises a second circuit carrier 9 and a second group 10 of the electronic components 7 is soldered onto said second circuit carrier. Accordingly, two contact pins 11 are soldered onto the second circuit carrier 9 so as to contact the second group 10 of the components 7 to a further vehicle electrical system that provides an operating voltage of 48V.

The contact pins 8 and 11 penetrate the housing cover 4 and are surrounded on the outer side of the housing by a respective connecting collar 12 (alternatively also described as a plug collar). When the assembly 1 is in the intended installed state in the motor vehicle, it is possible in each case for a plug connector of the respective vehicle electrical system, said plug connector comprising mating contacts for the contact pins 8 or 11 respectively, to be fastened to this connecting collar 12 by way of means for providing the mechanical fixing arrangement (latching hooks 13 in this case). A leak-tightness of the plug connection to prevent the penetration of moisture is also achieved by means of the connecting collar 12 (specifically by means of sealing elements, not illustrated).

As a result of using the assembly 1 as a control unit of the window actuator, the assembly 1 is regularly arranged in a so-called wet space—in the interior space of a side door—of the motor vehicle, in which the assembly 1 can be exposed on the outer side to (condensation) moisture or (in the case of rain) also water. A sealing collar 20 is formed on the inner side of the housing cover 4 in order to prevent an electrically conductive moisture bridge forming between the contact pins 8 and 11 in the case of a lack of leak-tightness of the housing 2 by way of example as a result of a rip in the housing cover 4, and consequently to prevent a short circuit occurring between the 12V and the 48V vehicle electrical systems. Said sealing collar surrounds the contact pins 11 in a circumferential manner and as illustrated in FIG. 1 in the final assembly state of the assembly 1 is in part immersed in a potting compound 22. This potting compound 22 is used so as to encase the components 7 and also the circuit carrier 5 or rather 9 in a media-impermeable manner.

By means of the sealing collar 20, moisture that penetrates within the sealing collar 20 (by way of the contact pins 11) or through a rip in the housing cover 4 into the housing 2 is prevented from forming an electrically conductive connection between the two groups (pairs) of contact pins 8 or 11 respectively and consequently also between the two vehicle electrical systems.

Initially, the two circuit carriers 5 and 9 are installed with the respective groups 6 or 10 respectively of the components 7 into the housing base part 3 and are placed on stops 24 that are formed at that location for the purpose of assembling the assembly 1. The potting compound 22 in fluid form is subsequently poured into the housing base part 3 in such manner that the components 7 are entirely encased. Afterwards, the housing cover 4 is placed on the housing base part 3 and the contact pins 8 or 11 respectively are guided through corresponding apertures within the connecting collars 12. The sealing collar 20 is immersed in the not yet cross-linked potting compound 22. The fill level of the potting compound 22 in the housing base part 3 is selected in addition to be of such a high level that the sealing collar 20 is at least in part immersed in the potting compound 22 when the housing cover 4 is in position on the housing base part 3. The housing cover 4 is welded or bonded to the housing base part 3. The potting compound 22 is subsequently thermoset by means of supplying heat.

Figure 2:
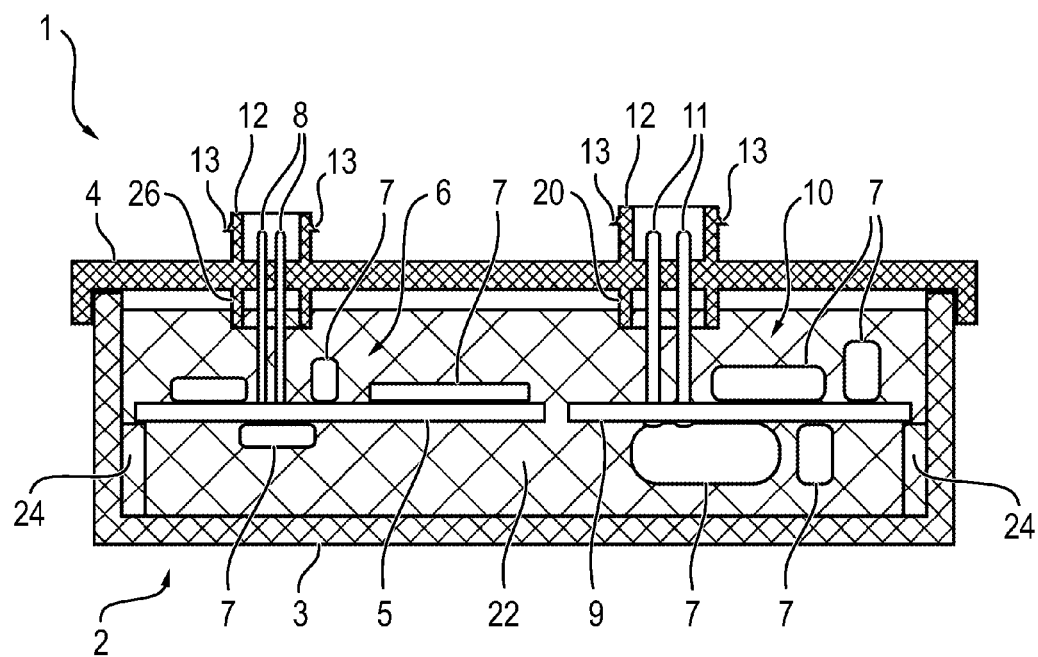

A further exemplary embodiment of the assembly group 1 is illustrated in FIG. 2. In this case, the housing cover 4 comprises a further sealing collar 26 that borders the contact pins 8 on the inner side of the housing in a circumferential manner and likewise is in part embedded in the potting compound 22. As a consequence, a particularly high operational reliability of the assembly 1 is achieved in the case of moisture having penetrated from the outside.

Figure 3:
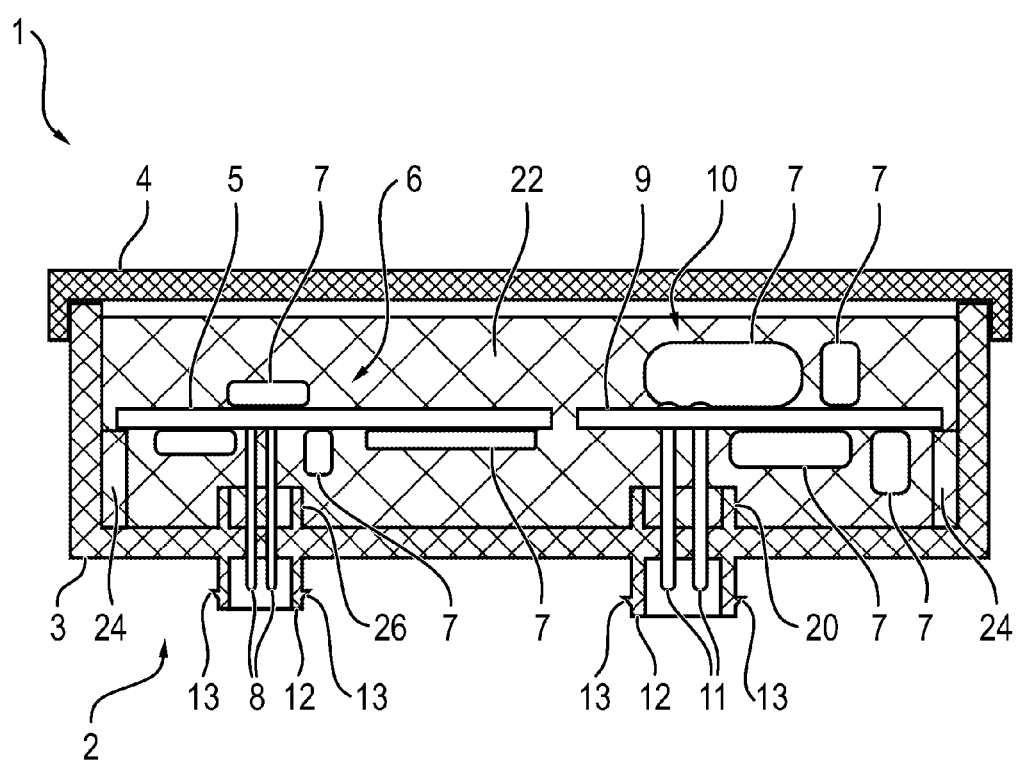

FIG. 3 illustrates an alternative exemplary embodiment of the assembly 1. In this case, the contact pins 8 and 11 are guided in each case out of the housing 2 through the housing base part 3. Accordingly, the connecting collars 12 and also the sealing collars 20 and 26 are formed on the housing base part 3. In this case, the two sealing collars 20 and 26 are entirely embedded in the potting compound 22. During the assembly process, the circuit carriers 5 or rather 9 are inserted in this case into the housing base part 3 and in each case the contact pins 8 or 11 respectively are guided through the corresponding apertures within the connecting collar 12. Subsequently, the potting compound 22 is poured in and the housing 2 is closed by means of the housing cover 4.

The subject matter of the invention is not limited to the above described exemplary embodiments. On the contrary, further embodiments of the invention can be derived by the person skilled in the art from the above description. In particular, the individual features of the invention and their embodiment variants that are described with reference to the different exemplary embodiments can also be combined with one another in other ways.

REFERENCE NUMERALS

1 Assembly
2 Housing
3 Housing Base Part
4 Housing Cover
5 Circuit Carrier
6 Group
7 Component
8 Contact Pin
9 Circuit Carrier
10 Group
11 Contact Pin
12 Connecting Collar
13 Latching Hook
20 Sealing Collar
22 Potting compound
24 Stop
26 Sealing Collar

The invention claimed is:

1. An electrical assembly for a motor vehicle, comprising:
a housing;
two groups of electronic components disposed in said housing;
two groups of connecting contacts each allocated to a respective one of said two groups of electronic components, said connecting contacts penetrating said housing and electrically contacting the respective said electronic components;
a sealing collar surrounding at least one of said groups of connecting contacts on an inner side of said housing and protruding from said housing;
a pot having a sidewall formed by said sealing collar and a base formed by said housing, wherein said connecting contacts penetrate said housing at said base of said pot; and
a potting compound encasing said two groups of electronic components in said housing and by entirely or partly immersing a wall of said pot, embedding said sealing collar in said potting compound in a final assembly state of the electrical assembly so that virtually no moisture can penetrate from an outer side of said pot into a pot interior and therefore to said connecting contacts extending therein.

2. The electrical assembly according to claim 1, wherein said two groups of the electronic components are configured for operation at mutually different operating voltages.

3. The electrical assembly according to claim 1, wherein said sealing collar is one of a plurality of sealing collars, each of said groups of the connecting contacts is surrounded on the inner side of said housing by a respective said sealing collar, and each sealing collar in the final assembly state is entirely or in part embedded in said potting compound.

4. The electrical assembly according to claim 3, wherein said housing comprises a housing base part and a housing cover, and wherein said sealing collars are integrally formed as one on said housing cover.

5. The electrical assembly according to claim 1, wherein said housing comprises a housing base part and a housing cover, and wherein said sealing collar is integrally formed as one on said housing cover.

6. The electrical assembly according to claim 1, wherein each said group of the connecting contacts is circumferentially surrounded on an outer side of said housing by a respective connecting collar that protrudes from said housing for receiving in each case a plug connector.

7. The electrical assembly according to claim 1, wherein said potting compound is a polyaddition thermosetting synthetic material.

8. The electrical assembly according to claim 1, wherein said two groups of electronic components comprise a plurality of electronic components disposed on a respective circuit carrier.

* * * * *